(12) United States Patent
Lee et al.

(10) Patent No.: US 6,982,775 B2
(45) Date of Patent: Jan. 3, 2006

(54) LIQUID CRYSTAL DISPLAY HAVING REDUCED FLICKER

(75) Inventors: Hsin-Ta Lee, Tao-Yuan Hsien (TW); Chao-Wen Wu, I-Lan Hsien (TW)

(73) Assignee: Chi Mei Optoelectronics Corporation, Tainan (TW)

(*) Notice: Subject to any disclaimer, the term of this patent is extended or adjusted under 35 U.S.C. 154(b) by 111 days.

(21) Appl. No.: 10/064,049

(22) Filed: Jun. 4, 2002

(65) Prior Publication Data

US 2003/0098935 A1 May 29, 2003

(30) Foreign Application Priority Data

Nov. 23, 2001 (TW) .............................. 90129131 A

(51) Int. Cl.
 *G02F 1/1343* (2006.01)
(52) U.S. Cl. .......................... 349/139; 349/39; 349/42; 349/43; 349/144; 349/149
(58) Field of Classification Search ................. 349/39, 349/42, 43, 144, 139, 149; 257/59, 72; 345/87–92
 See application file for complete search history.

(56) References Cited

U.S. PATENT DOCUMENTS

| 5,235,448 A | 8/1993 | Suzuki et al. |
| 5,369,512 A | 11/1994 | Yanai et al. |
| 5,459,596 A | 10/1995 | Ueda et al. |
| 5,546,205 A | 8/1996 | Sukegawa et al. |
| 5,629,783 A | 5/1997 | Kanbara et al. |
| 5,668,650 A | 9/1997 | Mori et al. |
| 5,745,194 A | 4/1998 | Nakashima et al. |
| 5,886,365 A | 3/1999 | Kouchi et al. |
| 5,978,059 A | 11/1999 | Ohta et al. |
| 6,020,214 A * | 2/2000 | Watanabe et al. ............. 438/30 |
| 6,028,650 A | 2/2000 | Kuroha et al. |
| 6,046,790 A * | 4/2000 | Hara et al. ................... 349/172 |
| 6,115,018 A | 9/2000 | Okumura et al. |
| 6,226,057 B1 * | 5/2001 | Lee .............................. 349/38 |
| 6,249,325 B1 | 6/2001 | Ohkawara et al. |
| 6,310,668 B1 * | 10/2001 | Ukita .......................... 349/42 |
| 6,504,585 B2 | 1/2003 | Ohkawara et al. |
| 6,507,375 B1 * | 1/2003 | Kawahata ..................... 349/38 |
| 6,707,441 B1 * | 3/2004 | Hebiguchi et al. ............ 345/92 |
| 2002/0080317 A1 | 6/2002 | Yeo et al. |

FOREIGN PATENT DOCUMENTS

| CN | 1287287 A | 3/2001 |
| JP | 04-225329 | 8/1992 |
| TW | 495635 | 7/2002 |

* cited by examiner

*Primary Examiner*—Ahshik Kim
(74) *Attorney, Agent, or Firm*—Winston Hsu

(57) ABSTRACT

A liquid crystal display (LCD) having reduced flicker includes a plurality of signal lines, a plurality of scanning lines, and a plurality of pixels. Each pixel includes a liquid crystal cell having a pixel electrode, a storage capacitor, and a switching transistor. The switching transistor includes a gate electrode connected to one of the scanning lines, a drain electrode connected to one of the signal lines, and a source electrode connected to the pixel electrode. An overlapping region is between the gate electrode and the source electrode. The area of the overlapping region increases by increasing the distance between an input end of the scanning line corresponding to the overlapping region and the pixel electrode corresponding to the overlapping region.

8 Claims, 5 Drawing Sheets

LIQUID CRYSTAL DISPLAY HAVING REDUCED FLICKER

BACKGROUND OF INVENTION

1. Field of the Invention

The present invention relates to a liquid crystal display, and more particularly, to a liquid crystal display having reduced flicker.

2. Description of the Prior Art

A thin film transistor display, such as a thin film transistor liquid crystal display (TFT-LCD), utilizes many thin film transistors, in conjunction with other elements such as capacitors and bonding pads, arranged in a matrix as switches for driving liquid crystal molecules to produce brilliant images. The advantages of the TFT-LCD over a conventional CRT monitor include better portability, lower power consumption, and lower radiation. Therefore, the TFT-LCD is widely used in various portable products, such as notebooks, personal data assistants (PDA), electronic toys, etc.

Referring to FIG. 1 and FIG. 2. FIG. 1 is a schematic diagram of a prior art TFT-LCD 10. FIG. 2 is an equivalent circuit diagram of the TFT-LCD 10. The TFT-LCD 10 comprises a scanning line control circuit 12, a signal line control circuit 14, and a pixel array 16 having a plurality of pixels connected to scanning lines. For example, a pixel A, a pixel B, and a pixel C are connected to a common scanning line. As shown in FIG. 2, a pixel 20 comprises a liquid crystal cell (LC), connected to a common counter electrode (CE), and a thin film transistor (TFT), which comprises a gate electrode connected to a scanning line $G_0$, a drain electrode connected to a signal line $D_0$, and a source electrode connected to a pixel electrode of the liquid crystal cell. Additionally, the pixel 20 contains a storage capacitor (SC) connected between the liquid crystal cell and a scanning line $G_1$. The storage capacitor is used to reduce the voltage variation of the liquid crystal cell due to current leakage and thus help the liquid crystal cell to store electric charges.

As shown in FIG. 2, the light passing through the pixels varies with the voltage applied to the liquid crystal cell. By changing the voltage to the liquid crystal cell, the amount of light passing through each pixel can be changed and thus the TFT-LCD can display predetermined images. The voltage applied to the liquid crystal cell is the difference between the voltage of the common counter electrode and the voltage of the pixel electrode. When the thin film transistor is turned off, the pixel electrode is on a floating status. If any fluctuations occur in the voltages of electric elements around the pixel electrode, the fluctuations will cause the voltage of the pixel electrode to deviate from its desirable voltage. The deviation of the voltage of the pixel electrode is referred to feed-through voltage ($V_{FD}$), which is represented by:

$$V_{FD} = [C_{GS}/(C_{LC} + C_{SC} + C_{GS})] * \Delta V_G \qquad (1)$$

where $C_{LC}$ is the capacitance of the liquid crystal cell (LC), $C_{SC}$ is the capacitance of the storage capacitor (SC), $C_{GS}$ is the capacitance between the source electrode and the gate electrode of the thin film transistor, and $\Delta V_G$ is the amplitude of a pulse voltage applied to the gate electrode.

In general, adjusting the voltage of the common counter electrode can compensate for the feed-through voltage. However, because the resistance and the capacitance of the scanning line round the falling edge of a pulse voltage applied to the gate electrode, a feed-through voltage of a pixel decreases as the distance between the scanning line control circuit and the pixel increases. For example, as shown in FIG. 1, feed-through voltage of the pixel A is larger than that of the pixel B, whose feed-through voltage is larger than that of the pixel C (that is, $(V_{FD})_A > (V_{FD})_B > (V_{FD})_C$ where $(V_{FD})_A, (V_{FD})_B$, and $(V_{FD})_C$ represent feed-through voltages of the pixels A, B, C, respectively). Accordingly, it is difficult to compensate feed-through voltages for all pixels by adjusting the voltage of the common counter electrode. Therefore, it is hard to provide a TFT-LCD without flicker.

The method disclosed in U.S. Pat. No. 6,028,650 attempts to solve the above-mentioned problem. Referring to FIG. 3. FIG. 3 is a top view of a pixel array 30 of the TFT-LCD 10. The pixel array 30 comprises scanning lines 32 and 32a connected to a scanning line control circuit (DR1), signal lines 34a, 34b, 34c, and pixels A, B, C, which correspond to pixels A, B, C shown in FIG. 1. Pixels A, B, C comprise thin film transistors $Q_A$, $Q_B$, $Q_C$ respectively, and their corresponding liquid crystal cells. The gate electrodes of thin film transistors $Q_A$, $Q_B$, $Q_C$ are connected to the scanning line 32. The drain electrodes of thin film transistors $Q_A$, $Q_B$, $Q_C$ are connected to signal lines 34a, 34b, 34c respectively. The source electrodes of thin film transistors $Q_A$, $Q_B$, $Q_C$ are respectively connected to pixel electrodes 38a, 38b, 38c of the liquid crystal cells.

To form the pixel array 30, first a patterned conductive layer, serving as scanning lines 32 and 32a, is formed on a substrate (not shown). Next, an insulating layer and a semi-conductive layer are sequentially added. Then, a second patterned conductive layer, serving as signal lines 34a, 34b, 34c, is deposited on the semi-conductive layer. Finally, a transparent conductive layer is deposited to form pixel electrodes 38a, 38b, and 38c of pixels A, B, C. An overlapping region 40a of the scanning line 32a and the pixel electrode 38a is a storage capacitor of the pixel A. Similarly, overlapping regions 40b, 40c are storage capacitors of pixels B, C. Capacitances of the storage capacitors of pixels A, B, C are represented by $(C_{SC})_A, (C_{SC})_B, (C_{SC})_C$. The area of the overlapping region 40a is larger than that of the overlapping region 40b, whose area is larger than that of the overlapping region 40c. As a result, $(C_{SC})_A$ is larger than $(C_{SC})_B$, which is larger than $(C_{SC})_C$. Thus, feed-through voltages of pixels A, B, C, represented by $(V_{FD})_A, (V_{FD})_B$, and $(V_{FD})_C$, are approximately equal (that is, $(V_{FD})_A \approx (V_{FD})_B \approx (V_{FD})_C$).

In brief, the above-mentioned method adjusts the capacitances of storage capacitors to compensate feed-through voltages of all the pixels. As a storage capacitor gets farther from the scanning line control circuit, its capacitance becomes smaller. As a result, it is hard for such storage capacitor with low capacitance to help the liquid crystal cells hold electric charges. Besides, as a storage capacitor gets closer to the scanning line control circuit, its capacitance becomes larger and thus, the width of the scanning line should be made wider so as to form the storage capacitor. However, the aperture ratio of the LCD apparatus will decrease as the width of the scanning line increases.

SUMMARY OF INVENTION

It is therefore a objective of the claimed invention to provide a liquid crystal display (LCD) having reduced flicker to solve the above-mentioned problem.

According to the claimed invention, a liquid crystal display (LCD) having reduced flicker includes a plurality of signal lines, a plurality of scanning lines, and a plurality of pixels. Each pixel includes a liquid crystal cell having a pixel electrode, a storage capacitor, and a switching transistor. The switching transistor includes a gate electrode connected to one of the scanning lines, a drain electrode connected to one of the signal lines, and a source electrode connected to the pixel electrode. An overlapping region is between the gate electrode and the source electrode. The area of the overlapping region increases by increasing the distance between an input end of the scanning line corresponding to the overlapping region and the pixel electrode corresponding to the overlapping region.

It is an advantage that the claimed invention adjusts the capacitance between the gate electrode and the source electrode of the thin film transistor by varying the areas of the overlapping regions so that feed-through voltages of all pixels are approximately equal. There are no changes occurring to the storage capacitors and the width of the scanning lines. Thus, the storage capacitors can help the liquid crystal cells hold the electric charges effectively. The aperture ratio of the LCD apparatus can be improved as well.

These and other objectives of the claimed invention will no doubt become obvious to those of ordinary skill in the art after reading the following detailed description of the preferred embodiment, which is illustrated with figures and drawings.

DETAILED DESCRIPTION

Figure 1:
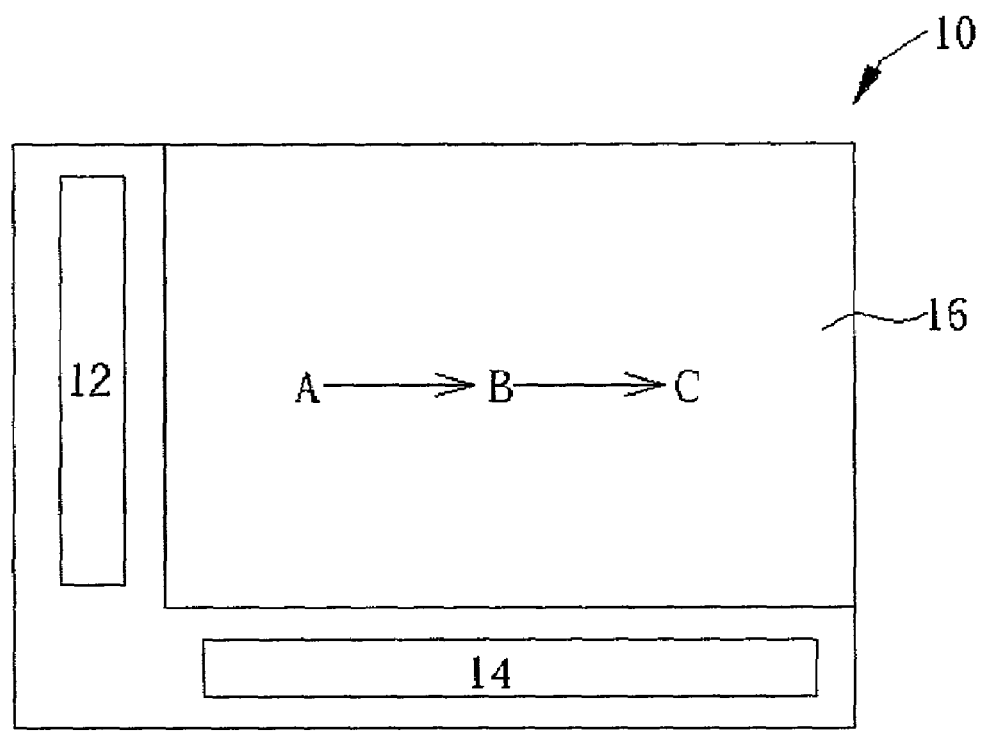
FIG. 1 is a schematic diagram of a prior art TFT-LCD.
Figure 2:
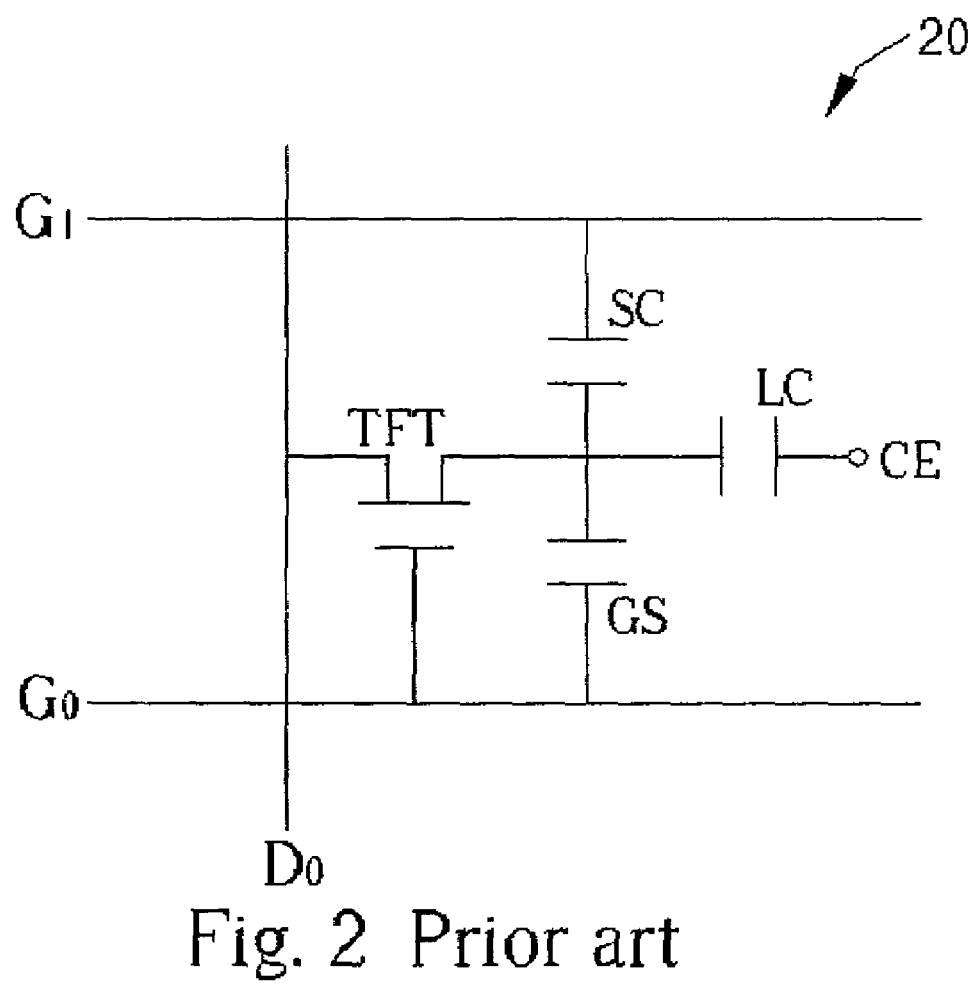
FIG. 2 is a circuit diagram of the TFT-LCD shown in FIG. 1.
Figure 3:
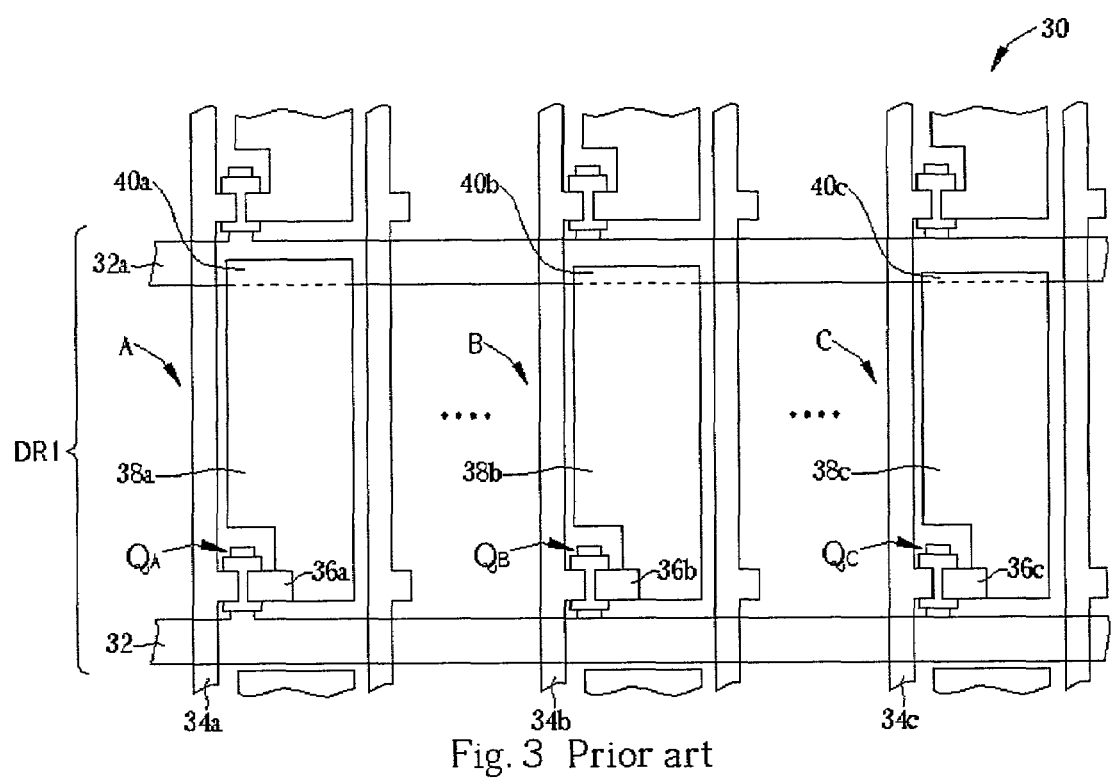
FIG. 3 is a top view of a pixel array of the TFT-LCD in FIG. 1.
Figure 4:
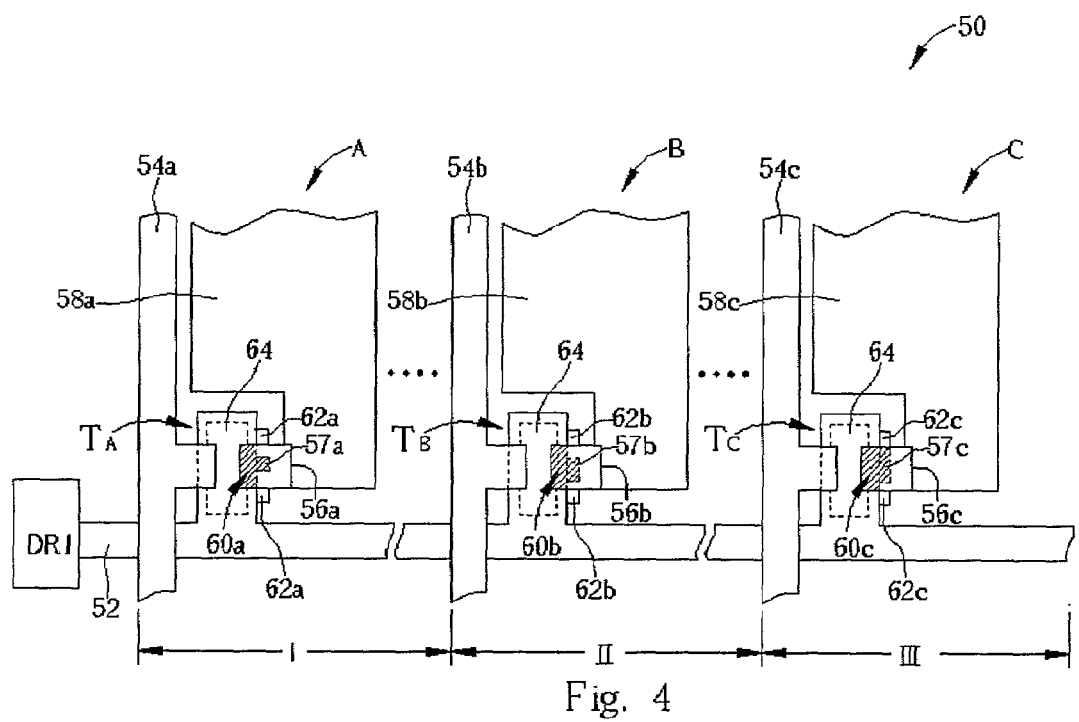
FIG. 4 is a top view of a pixel array of a TFT-LCD according to the present invention.

Referring to FIG. 4, FIG. 4 is a top view of a pixel array of a TFT-LCD according to the present invention. As shown in FIG. 4, a pixel array 50 comprises a scanning line 52 electrically connected to a scanning line control circuit (DR1), signal lines 54a, 54b, 54c, and pixels A, B, C, which respectively correspond to pixels A, B, C shown in FIG. 1. Pixels A, B, C comprise thin film transistors $T_A$, $T_B$, $T_C$ respectively, and their corresponding liquid crystal cells. The gate electrodes of thin film transistors $T_A$, $T_B$, $T_C$ are connected to the scanning line 52. The drain electrodes of thin film transistors $T_A$, $T_B$, $T_C$ are connected to signal lines 54a, 54b, 54c respectively. The source electrodes of thin film transistors $T_A$, $T_B$, $T_C$ are respectively connected to pixel electrodes 58a, 58b, 58c of the liquid crystal cells. Region 60a (drawn as slash) is an overlapping region of the scanning line 52 and the source electrode 56a. Region 60b (drawn as slash) is an overlapping region of the scanning line 52 and the source electrode 56b. Region 60c (drawn as slash) is an overlapping region of the scanning line 52 and the source electrode 56c. In addition, the gate electrodes of thin film transistors $T_A$, $T_B$, $T_C$ comprise blocks 57a, 57b, 57c which are located within overlapping regions 60a, 60b, 60c. The area of the block 57a is smaller than that of the block 57b, whose area is smaller than that of the block 57c. Thus, the area of the overlapping region 60a is smaller than that of the overlapping region 60b, whose area is smaller than that of the overlapping region 60c. A pair of protective structures 62a is provided, preventing the block 57a from being separated from the gate electrode. The protective structures 62a are located on both sides of the block 57a or within the overlapping region 60a. Similarly, protective structures 62b, 62c are provided for preventing the blocks 57b, 57c from being separated from the gate electrodes.

To form the pixel array 50, first a patterned conductive layer, serving as the scanning line 52, is formed on a substrate (not shown). Then, an insulating layer and a semi-conductive layer are sequentially deposited on the scanning line 52 and the substrate. A second patterned conductive layer, serving as signal lines 54a, 54b, 54c, is deposited on the semi-conductive layer. Finally, a transparent conductive layer is deposited to form pixel electrodes 58a, 58b, 58c of pixels A, B, C.

Please refer to equation (1). In general, both $C_{SC}$ and $C_{LC}$ are much larger than $C_{SC}$ (i.e. $C_{SC}$, $C_{LC}$>>$C_{GS}$). Therefore, equation (1) can be rewritten as follows:

$$V_{FD}=[C_{GS}/(C_{LC}+C_{SC})]*\Delta V_G \qquad (2)$$

Please refer to equation (2). Regarding pixels A, B, C shown in FIG. 4, if $(C_{GS})_A=(C_{GS})_B=(C_{GS})_C$, $(C_{SC})_A=(C_{SC})_B=(C_{SC})_C$, and $(C_{LC})_A=(C_{LC})_B=(C_{LC})_C$, the feed-through voltages of pixels A, B, C is $(V_{FD})_A>(V_{FD})_B>(V_{FD})_C$. However, if $(C_{GS})_A<(C_{GS})_B<(C_{GS})_C$, $(C_{SC})_A=(C_{SC})_B=(C_{SC})_C$, and $(C_{LC})_A=(C_{LC})_B=(C_{LC})_C$, then $(V_{FD})_A\approx(V_{FD})_B\approx(V_{FD})_C$. That is, feed-through voltages of pixels A, B, C, are approximately equal as long as the condition $(C_{GS})_A<(C_{GS})_B<(C_{GS})_C$ is achieved. Accordingly, the present invention is adding blocks 57a, 57b, 57c beside the gate electrodes. The area of the overlapping region 60a is smaller than that of the overlapping region 60b, whose area is smaller than that of the overlapping region 60c. In this manner, $(C_{GS})_A$ is smaller than $(C_{GS})_B$, which is smaller than $(C_{GS})_C$. Thus, feed-through voltages of pixels A, B, C, are approximately equal (that is, $(V_{FD})_A\approx(V_{FD})_B\approx(V_{FD})_C$).

In the first embodiment of the present invention, there are 1024 pixels in the pixel array 50, which is divided into a plurality of regions. The blocks added beside the gate electrodes in a common region have approximately equal areas. The area of the block in a first region is greater than the area of the block in a second region adjacent to the first region by a predetermined value. For example, as shown in FIG. 4, as the region I is next to the region II, an area of the block 57b is greater than an area of the block 57a by the predetermined value. Similarly, as the region II is next to the region III, an area of the block 57c is greater than an area of the block 57b by the predetermined value. Additionally, the shapes of blocks 57a, 57b, 57c are not necessarily rectangular. They can be any shape as long as the area of the overlapping region 60a is smaller than that of the overlapping region 60b, whose area is smaller than that of the overlapping region 60c.

Figure 5:
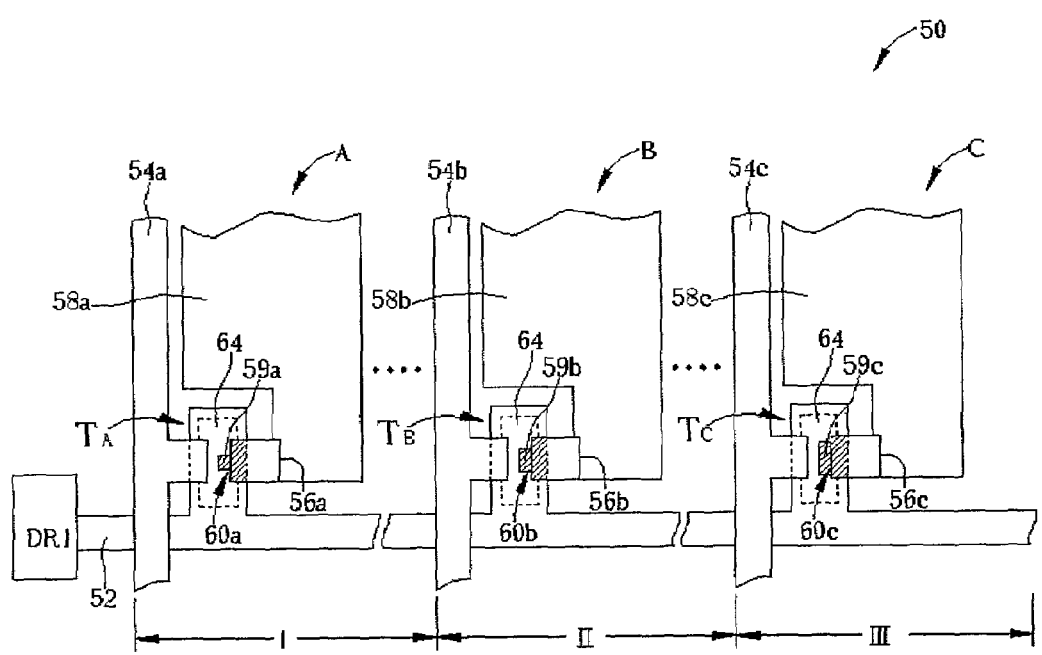
FIG. 5 is a top view of the pixel array of another TFT-LCD according to the present invention.

Please refer to FIG. 5. FIG. 5 is a top view of a pixel array of another embodiment of TFT-LCD according to the present invention. As shown in FIG. 5, the source electrodes of thin film transistors $T_A$, $T_B$, $T_C$ comprise blocks 59a, 59b, 59c, which are located within the overlapping regions 60a, 60b, 60c (drawn as slash). The area of the block 59a is smaller than that of the block 59b, whose area is smaller than that of the block 59c. Thus, the area of the overlapping region 60a is smaller than that of the overlapping region 60b, whose area is smaller than that of the overlapping region 60c. In this manner, $(C_{GS})_A$ is smaller than $(C_{GS})_B$, which is smaller than $(C_{GS})_C$. Thus, feed-through voltages of pixels A, B, C, are approximately equal (that is, $(V_{FD})_A\approx(V_{FD})_B\approx(V_{FD})_C$). It should be again noted that the blocks 59a, 59b, 59c can be any shape as long as an area of the overlapping region 60a is smaller than that of the overlapping region 60b, whose area is smaller than that of the overlapping region 60c.

Furthermore, in both embodiments, the pixel array 50 can be divided into 1024 regions where each region comprises only one pixel. In this manner, feed-through voltages of all pixels are precisely equal.

In brief, the present invention adjusts the capacitance $C_{GS}$ between the gate electrode and the source electrode of the thin film transistor so that feed-through voltages of all pixels are approximately equal. To adjust the capacitance $C_{GS}$, blocks with variable areas are added to the gate electrodes or to the source electrodes. An area of an overlapping region of the gate electrode and the source electrode is increased by increasing the distance between an input end of the scanning line corresponding to the overlapping region and the pixel corresponding to the overlapping region. Thus, the capacitance $C_{GS}$ can be effectively adjusted.

In comparison with prior art, the present invention adjusts the capacitance $C_{GS}$ by varying areas of the overlapping regions of the gate electrode and the source electrode so that feed-through voltages of all pixels are approximately equal. Therefore, a liquid crystal display having reduced flicker is provided. There are no changes occurring on the storage capacitors and the width of the scanning lines. Thus, the storage capacitors can help the liquid crystal cells hold an electric charge effectively. The aperture ratio of the LCD apparatus can be improved as well.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A liquid crystal display comprising:
   a plurality of signal lines;
   a plurality of scanning lines electrically connected to a scanning line control circuit; and
   a plurality of pixels, each pixel comprising:
      a liquid crystal cell having a pixel electrode and a storage capacitor, and
      a switching transistor comprising a gate electrode connected to a scanning line, a drain electrode connected to one of the signal lines, and a source electrode connected to the pixel electrode, the gate electrode and the source electrode having an overlapping region, the size of the overlapping region of a pixel closer to the scanning line control circuit being smaller than the size of the overlapping region of another pixel farther from the scanning line control circuit.

2. The liquid crystal display of claim 1 wherein the gate electrode of each pixel comprises a first block located within the overlapping region, and an area of the first block of a pixel closer to the scanning line control circuit is smaller than an area of the first block of another pixel farther from the scanning line control circuit.

3. The liquid crystal display of claim 1 wherein the source electrode comprises a second block of each pixel located within the overlapping region, and an area of the second block of a pixel closer to the scanning line control circuit is smaller than an area of the second block of another pixel farther from the scanning line control circuit.

4. The liquid crystal display of claim 2 wherein the gate electrode further comprises a pair of protective structures located on both sides of the first block for preventing the first block from being separated from the gate electrode.

5. A liquid crystal display comprising:
   a scanning line connected to a scanning line control circuit;
   a first region comprising at least a first transistor having a first gate electrode connected to the scanning line, a first drain electrode connected to a first signal line, and a first source electrode connected to a first pixel electrode, the first gate electrode and the first source electrode having a first overlapping region;
   a second region located between the scanning line control circuit and the first region comprising at least a second transistor having a second gate electrode connected to the scanning line, a second drain electrode connected to a second signal line, and a second source electrode connected to a second pixel electrode, the second gate electrode and the second source electrode having a second overlapping region, the size of the first overlapping region being greater than the size of the second overlapping region; and
   a third region located between the scanning line control circuit and the second region comprising at least a third transistor having a third gate electrode connected to the scanning line, a third drain electrode connected to a third signal line, and a third source electrode connected to a third pixel electrode, the third gate electrode and the third source electrode having a third overlapping region, the size of the second overlapping region being greater than the size of the third overlapping region.

6. The liquid crystal display of claim 5 wherein the first gate electrode comprises a first block located within the first overlapping region, and the second gate electrode comprises a second block located within the second overlapping region, and an area of the first block is greater than that of the second block.

7. The liquid crystal display of claim 6 wherein the first gate electrode further comprises a pair of protective structures located on both sides of the first block for preventing the first block from being separated from the first gate electrode.

8. The liquid crystal display of claim 5 wherein the first source electrode comprises a third block located within the first overlapping region, and the second source electrode comprises a fourth block located within the second overlapping region, and an area of the third block is greater than an area of the fourth block.

* * * * *